United States Patent
Bchir et al.

(10) Patent No.: US 8,742,603 B2
(45) Date of Patent: Jun. 3, 2014

(54) PROCESS FOR IMPROVING PACKAGE WARPAGE AND CONNECTION RELIABILITY THROUGH USE OF A BACKSIDE MOLD CONFIGURATION (BSMC)

(75) Inventors: Omar J. Bchir, San Diego, CA (US);
Milind P. Shah, San Diego, CA (US);
Sashidhar Movva, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 75 days.

(21) Appl. No.: 12/882,525

(22) Filed: Sep. 15, 2010

(65) Prior Publication Data
US 2011/0285026 A1 Nov. 24, 2011

Related U.S. Application Data

(60) Provisional application No. 61/346,725, filed on May 10, 2010.

(51) Int. Cl.
*H01L 23/29* (2006.01)
(52) U.S. Cl.
USPC ........... 257/790; 257/E21.499; 257/686; 257/723; 438/108; 438/109
(58) Field of Classification Search
CPC .................. H01L 23/48; H01L 21/50
USPC ........... 257/E21.499, E23.01, 685, 686, 723, 257/737, 773, 777, 778; 438/108, 109, 125
See application file for complete search history.

(56) References Cited

U.S. PATENT DOCUMENTS

| | | | | |
|---|---|---|---|---|
| 5,438,224 A * | 8/1995 | Papageorge et al. | ...... | 257/777 |
| 6,016,013 A * | 1/2000 | Baba | ...... | 257/778 |
| 6,054,171 A | 4/2000 | Shoji | | |
| 6,137,164 A * | 10/2000 | Yew et al. | ...... | 257/686 |
| 6,181,569 B1 * | 1/2001 | Chakravorty | ...... | 361/761 |
| 6,462,421 B1 * | 10/2002 | Hsu et al. | ...... | 257/777 |
| 6,774,473 B1 * | 8/2004 | Shen | ...... | 257/686 |
| 6,798,057 B2 * | 9/2004 | Bolkin et al. | ...... | 257/686 |
| 6,815,254 B2 * | 11/2004 | Mistry et al. | ...... | 438/108 |

(Continued)

FOREIGN PATENT DOCUMENTS

| | | |
|---|---|---|
| JP | 10125720 A | 5/1998 |
| JP | 2000150557 A | 5/2000 |

(Continued)

OTHER PUBLICATIONS

International Search Report and Written Opinion—PCT/US2011/037211—ISA/EPO—Aug. 30, 2011.

*Primary Examiner* — Chris Chu
(74) *Attorney, Agent, or Firm* — Michelle S. Gallardo

(57) ABSTRACT

A backside mold configuration (BSMC) process for manufacturing packaged integrated circuits includes applying a mold compound to a side of a packaging substrate opposite an attached die. The mold compound is deposited on a dielectric (such as photo resist). The mold compound and dielectric are patterned after coupling a die to the packaging substrate to expose a contact pad of the packaging substrate. After patterning the mold compound and dielectric, a packaging connection is coupled to contact pads through the mold compound and dielectric. The mold compound surrounding the packaging connection reduces warpage of the packaging substrate during processing. Additionally, patterning the dielectric after attaching the die improves reliability of the packaging connection.

13 Claims, 14 Drawing Sheets

(56) References Cited

U.S. PATENT DOCUMENTS

| | | | |
|---|---|---|---|
| 6,856,009 B2 * | 2/2005 | Bolken et al. | 257/686 |
| 7,070,207 B2 | 7/2006 | Asai | |
| 7,141,873 B2 * | 11/2006 | Aoyagi | 257/686 |
| 7,348,215 B2 | 3/2008 | Lee | |
| 7,462,510 B2 | 12/2008 | James et al. | |
| 7,737,565 B2 * | 6/2010 | Coffy | 257/787 |
| 7,749,882 B2 | 7/2010 | Kweon et al. | |
| 7,777,351 B1 | 8/2010 | Berry et al. | |
| 7,795,721 B2 * | 9/2010 | Kurita | 257/698 |
| 7,867,818 B2 * | 1/2011 | Suh et al. | 438/107 |
| 7,871,861 B2 * | 1/2011 | Song et al. | 438/122 |
| 7,935,991 B2 | 5/2011 | Wood et al. | |
| 7,956,453 B1 | 6/2011 | Kim et al. | |
| 8,004,074 B2 * | 8/2011 | Mori et al. | 257/686 |
| 8,008,121 B2 * | 8/2011 | Choi et al. | 438/107 |
| 8,022,523 B2 * | 9/2011 | Chen et al. | 257/686 |
| 8,106,495 B2 * | 1/2012 | Kajiki | 257/678 |
| 8,148,806 B2 * | 4/2012 | Lin et al. | 257/686 |
| 8,378,477 B2 | 2/2013 | Do et al. | |
| 2001/0013653 A1 | 8/2001 | Shoji | |
| 2002/0030261 A1 * | 3/2002 | Rolda et al. | 257/685 |
| 2003/0042564 A1 * | 3/2003 | Taniguchi et al. | 257/438 |
| 2003/0218250 A1 | 11/2003 | Kung et al. | |
| 2004/0036164 A1 * | 2/2004 | Koike et al. | 257/723 |
| 2006/0012037 A1 * | 1/2006 | Raedt et al. | 257/737 |
| 2006/0134833 A1 * | 6/2006 | Baek et al. | 438/108 |
| 2006/0261446 A1 | 11/2006 | Wood et al. | |
| 2006/0284299 A1 | 12/2006 | Karnezos | |
| 2007/0221400 A1 | 9/2007 | Kurashina et al. | |
| 2008/0116574 A1 | 5/2008 | Fan | |
| 2008/0185708 A1 * | 8/2008 | Chen et al. | 257/698 |
| 2008/0258289 A1 | 10/2008 | Pendse et al. | |
| 2008/0284017 A1 | 11/2008 | Lee et al. | |
| 2009/0045513 A1 | 2/2009 | Kim et al. | |
| 2009/0095518 A1 | 4/2009 | Matsushita et al. | |
| 2009/0236718 A1 | 9/2009 | Yang et al. | |
| 2010/0059873 A1 | 3/2010 | Chow et al. | |
| 2010/0171205 A1 | 7/2010 | Chen et al. | |
| 2011/0089563 A1 | 4/2011 | Kikuchi et al. | |
| 2011/0157452 A1 | 6/2011 | Goh et al. | |
| 2011/0157853 A1 | 6/2011 | Goh | |
| 2011/0201194 A1 | 8/2011 | Gruber et al. | |
| 2011/0272819 A1 | 11/2011 | Park et al. | |
| 2013/0062746 A1 | 3/2013 | Schwarz et al. | |
| 2013/0244384 A1 | 9/2013 | Schwarz et al. | |

FOREIGN PATENT DOCUMENTS

| | | |
|---|---|---|
| JP | 2004240233 A | 8/2004 |
| JP | 2009094195 A | 4/2009 |
| KR | 20080111328 A | 12/2008 |

* cited by examiner

US 8,742,603 B2

PROCESS FOR IMPROVING PACKAGE WARPAGE AND CONNECTION RELIABILITY THROUGH USE OF A BACKSIDE MOLD CONFIGURATION (BSMC)

CROSS REFERENCE TO RELATED APPLICATION

This application claims the benefit of U.S. Provisional Patent Application No. 61/346,725 entitled "Process for Improving Package Warpage and Connection Reliability through Use of a Backside Mold Configuration (BSMC)" to BCHIR et al., filed on May 20, 2010.

TECHNICAL FIELD

The present disclosure generally relates to integrated circuits. More specifically, the present disclosure relates to packaging integrated circuits.

BACKGROUND

Packaged integrated circuits are continuously shrinking in thickness to fit smaller form factor electronic devices. As a result, the packaging substrate is shrinking in thickness, which reduces the stiffness of the packaging substrate. During manufacturing processes that apply heat to the substrate such as, for example, solder reflow, the substrate may warp. The warpage may be due to stress applied to the packaging substrate from differences in coefficients of thermal expansion between materials in the packaging substrate. When the packaging substrate warps, no-connects between the packaging substrate and the attached die may occur, resulting in electrical failure of the packaged integrated circuit.

FIG. 1 is a cross-sectional view illustrating die non-connects resulting from substrate warpage in a conventional packaged integrated circuit. A packaged integrated circuit includes a packaging substrate 102 having a packaging connection 104. A die 112 is coupled to the packaging connection 104 through a packaging connection 114. When the packaging substrate 102 warps during manufacturing the packaging connection 104 may become disconnected from the packaging connection 114 in portions of the packaged integrated circuit.

Additionally, during packaging of the integrated circuit, the packaging substrate has openings in a solder resist layer exposing contact pads of the packaging substrate. The openings are present in the packaging substrate before attaching the die to the packaging substrate. As a result, the contact pads of the packaging substrate are exposed to atmosphere during manufacturing processes such as heating, reflow, and deflux. High temperatures in these manufacturing process degrade the contact pad through oxidization, which reduces the reliability of electronic connections made to the contact pad.

Thus, there is a need to more reliably package integrated circuits using thin substrates.

BRIEF SUMMARY

According to one embodiment of the disclosure, an integrated circuit (IC) packaging method includes attaching a die to a first side of a substrate. The method also includes depositing a mold compound on a second side of the substrate before attaching the die to the first side of the substrate. The method further includes depositing a packaging connection on the second side of the substrate that couples to a contact pad on the second side of the substrate.

According to another embodiment of the disclosure, an apparatus includes a substrate. The apparatus also includes a dielectric on a first side of the substrate. The apparatus further includes a mold compound on the dielectric. The apparatus also includes a packaging connection coupled to a contact pad on the first side of the substrate through the mold compound and the dielectric.

According to yet another embodiment of the disclosure, an apparatus includes a substrate. The apparatus also includes a dielectric on a first side of the substrate. The apparatus further includes a packaging connection coupled to a contact pad on the first side of the substrate through the dielectric. The apparatus also includes means for improving packaging connection reliability on the first side of the substrate, in which the improving means surrounds the packaging connection.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Reducing warpage during packaging and increasing the yield of die connects may be accomplished through use of a backside mold compound (BSMC) by depositing a mold compound on a side of a packaging substrate opposite the side attached to a die. The mold compound adds stiffness to the packaging substrate to reduce warpage. Additionally, the mold compound supports packaging connections to the packaging substrate and inhibits crack formation in the packaging connections. The mold compound is patterned after die attach along with a dielectric (such as solder resist) to expose contact pads of the packaging substrate for electronic connections. Exposing the contact pads after die attach reduces damage, such as oxidation, to the contact pads during manufacturing processes.

Figure 1:
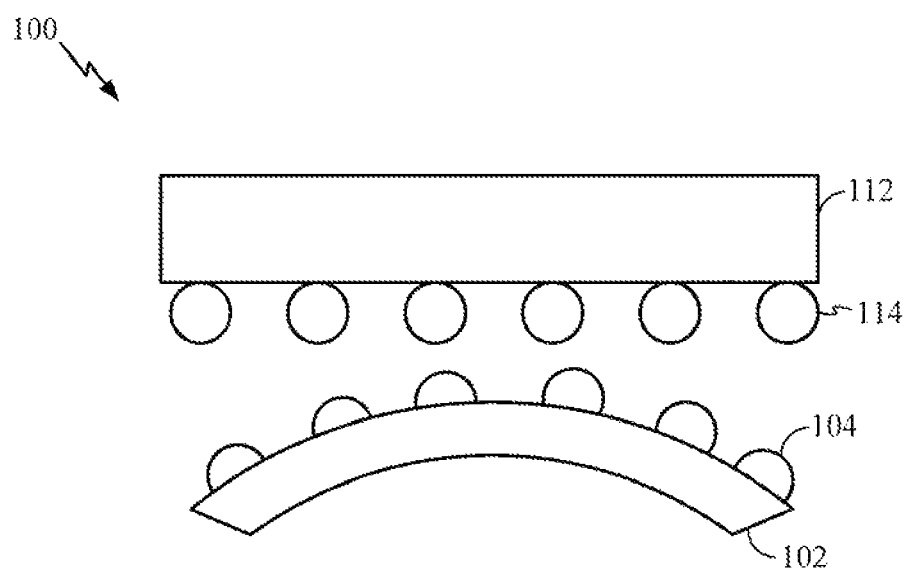
FIG. 1 is a cross-sectional view illustrating die non-connects resulting from substrate warpage in a conventional packaged integrated circuit.
Figure 2:
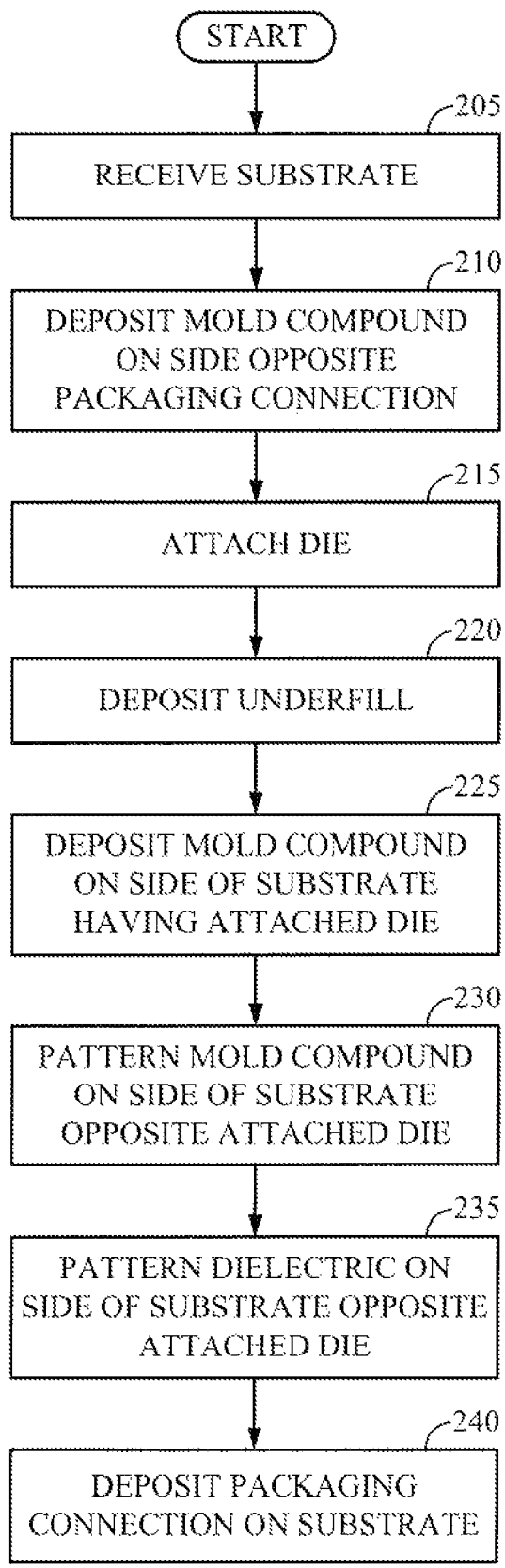
FIG. 2 is a flow chart illustrating an exemplary process for improving packaging connection reliability in packaged integrated circuits according to one embodiment.
Figure 3A:
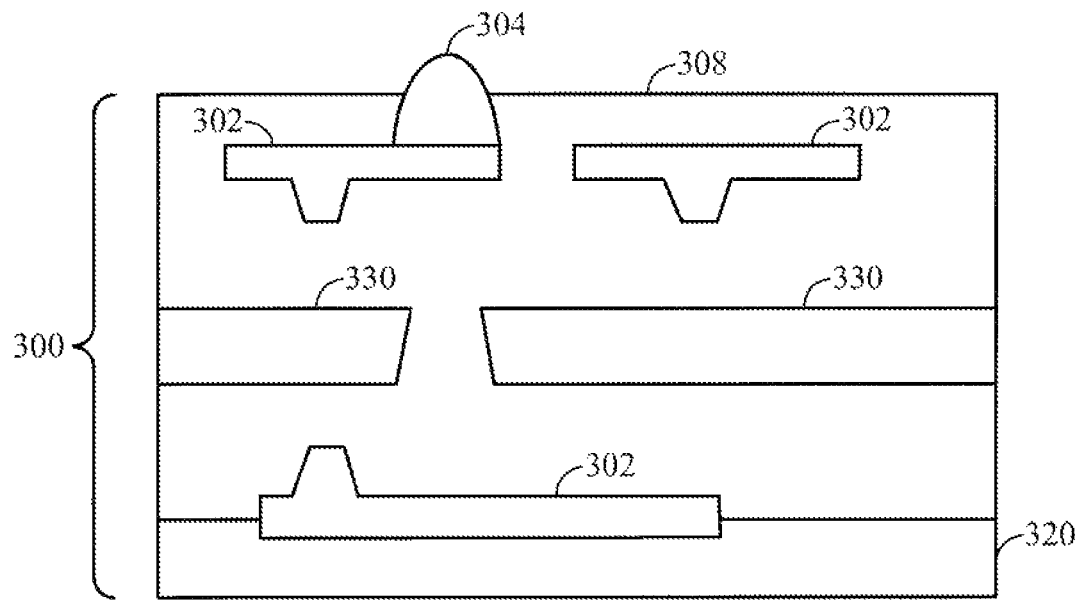
FIGS. 3A-3H are cross-sectional views illustrating an exemplary process for improving packaging connection reliability in packaged integrated circuits according to one embodiment.

FIG. 2 is, flow chart illustrating an exemplary process for improving packaging connection reliability in packaged integrated circuits according to one embodiment. A process begins at block 205 with receiving a packaging substrate. FIG. 3A is a cross-sectional view illustrating an exemplary packaging substrate according to one embodiment. A packaging substrate 300 includes conductive lines 302 separated by an insulator 308 on a base material 330 such as, for example, a laminate. A packaging connection 304 is coupled to a contact pad of the conductive lines 302. A dielectric 320 is located on the packaging substrate on a side opposite the packaging connection 304. According to one embodiment, the dielectric 320 is a solder resist.

Figure 3B:
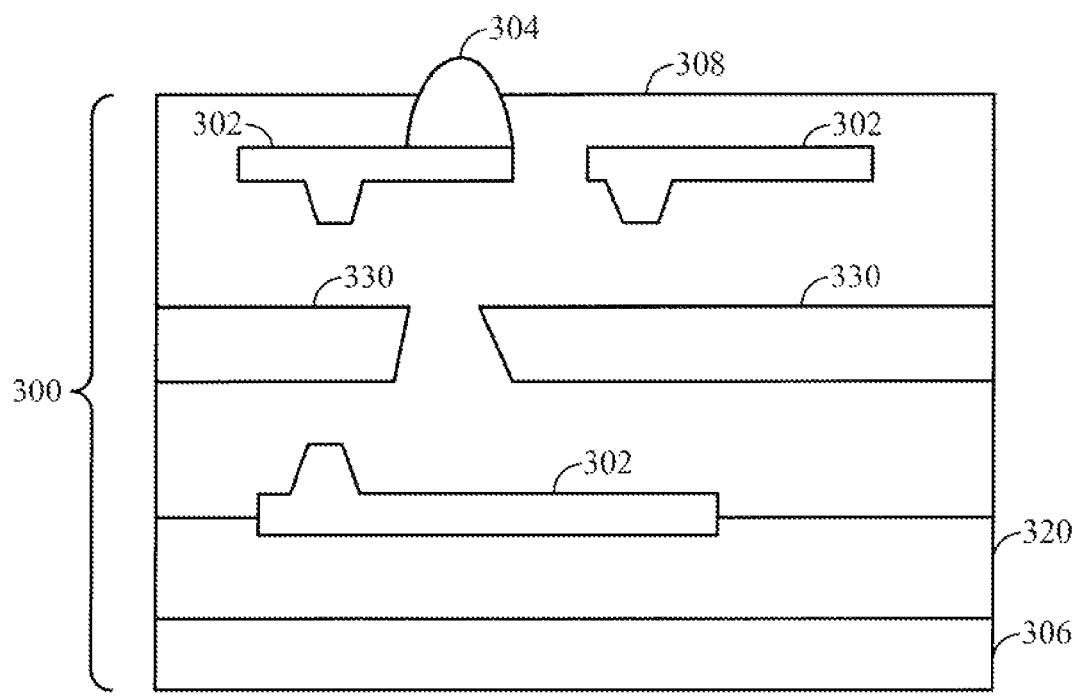

At block 210 a mold compound is deposited on the side opposite the packaging connection. FIG. 3B is a cross-sectional view illustrating an exemplary packaging substrate after deposition of a mold compound according to one embodiment. The packaging substrate 300 includes a mold compound 306 deposited on the dielectric 320 on a side of the packaging substrate 300 opposite the packaging connection 304.

The mold compound 306 improves stiffness of the packaging substrate 300. Thus, warpage of the packaging substrate 300 may be reduced. As illustrated later in FIG. 3H, the mold compound 306 may add little or no thickness to the packaged integrated circuit.

Figure 3C:
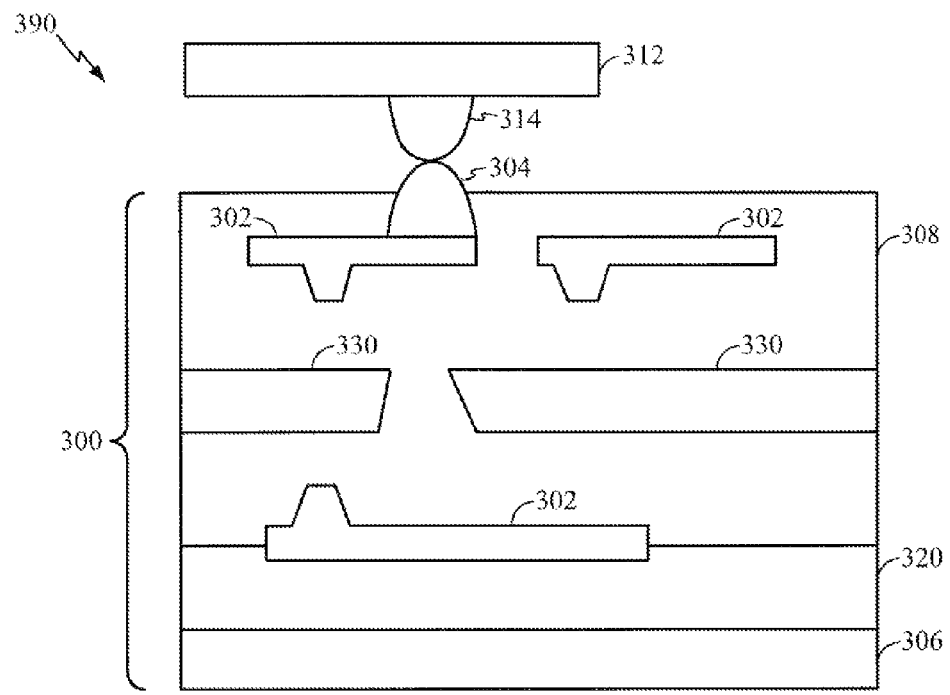

At block 215 a die is attached to the packaging substrate. FIG. 3C is a cross-sectional view illustrating an exemplary packaged integrated circuit according to one embodiment. A die 312 having packaging connection 314 is coupled to the packaging connection 304 of the packaging substrate 300. The die 312 and the packaging substrate 300 form a packaged integrated circuit 390.

Figure 3D:
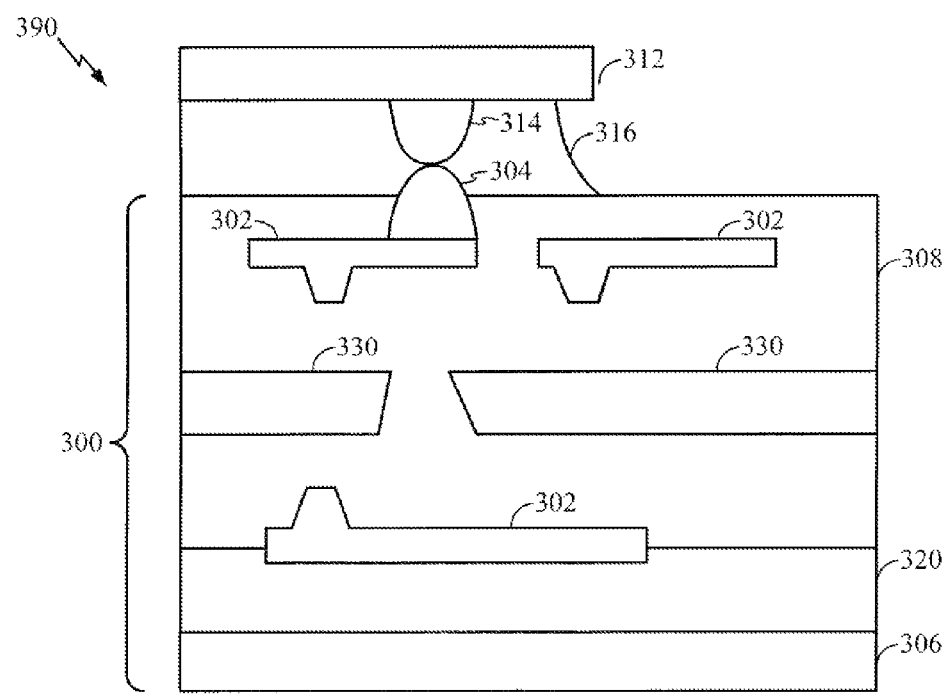

At block 220 an underfill is deposited around the packaging connections between the die and the packaging substrate. FIG. 3D is a cross-sectional view illustrating an exemplary packaged integrated circuit having underfill according to one embodiment. An underfill 316 provides additional support for the packaging connections 304, 314.

Figure 3E:
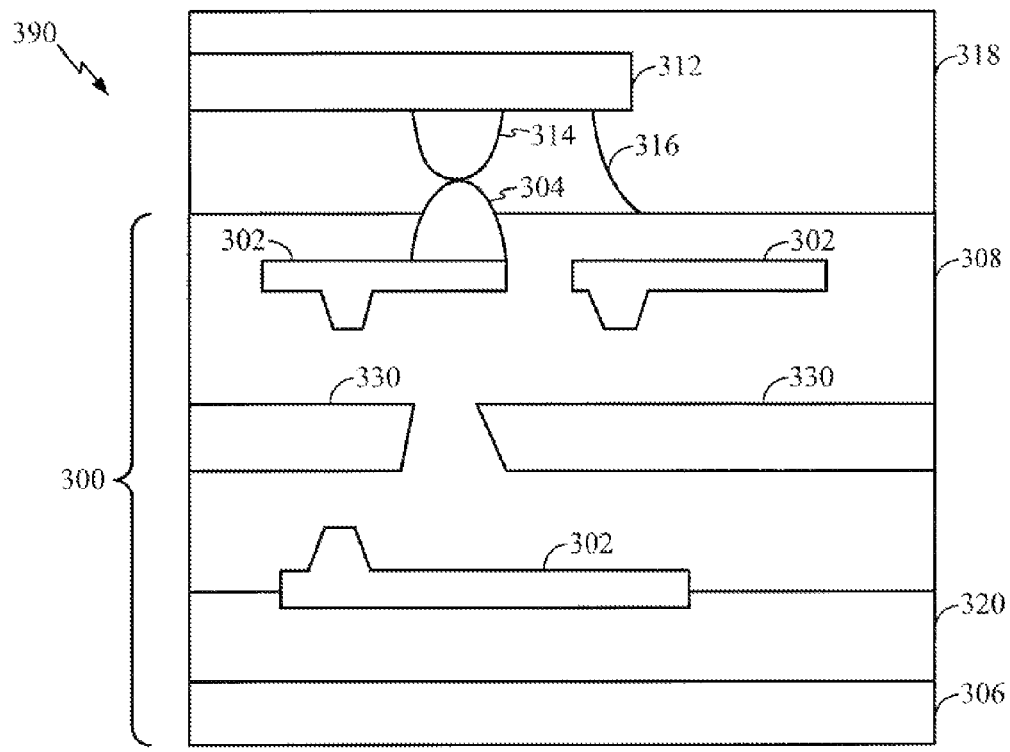

At block 225 mold compound is deposited on the die and the packaging substrate. FIG. 3E is a cross-sectional view illustrating an exemplary packaged integrated circuit having a mold compound deposited on the die and the packaging substrate according to one embodiment. A mold compound 318 surrounds the die 312 and further strengthens the connection between the packaging connection 304 and the packaging connection 314. The mold compound 318 may be a different material than the mold compound 306.

According to one embodiment, when the process is applied at the wafer level, the mold compound 318 may be diced into groups of dies to minimize or reduce warpage. For example, dicing through the mold compound 318 may be performed after placing each modular cluster of four dies on the packaging substrate. According to one embodiment, the mold compound 318 is not deposited on the die 312 resulting in a bare die or exposed die. An exposed die may be used for example, during manufacturing of package on package (PoP) integrated circuits.

Figure 3F:
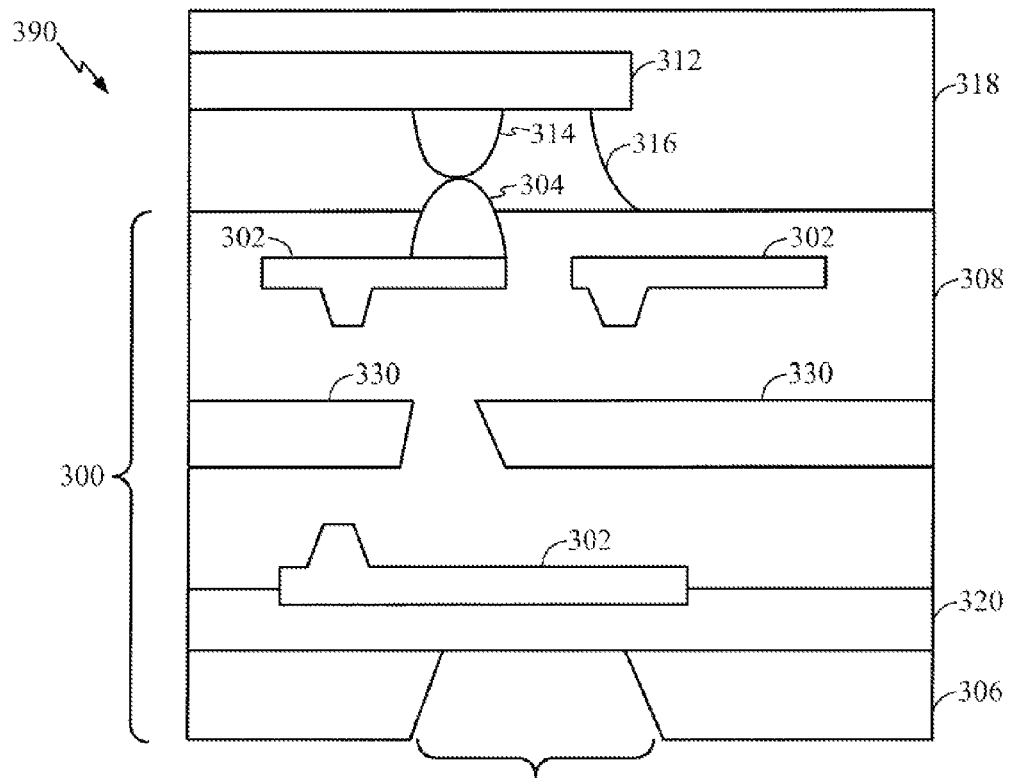

At block 230 the mold compound on the side of the packaging substrate opposite the attached die is patterned. FIG. 3F is a cross-sectional view illustrating an exemplary packaged integrated circuit having a patterned mold compound according to one embodiment. An opening 340 is patterned in the mold compound 306. The opening 340 may be for a ball grid array (BGA) deposited later during packaging.

Figure 3G:
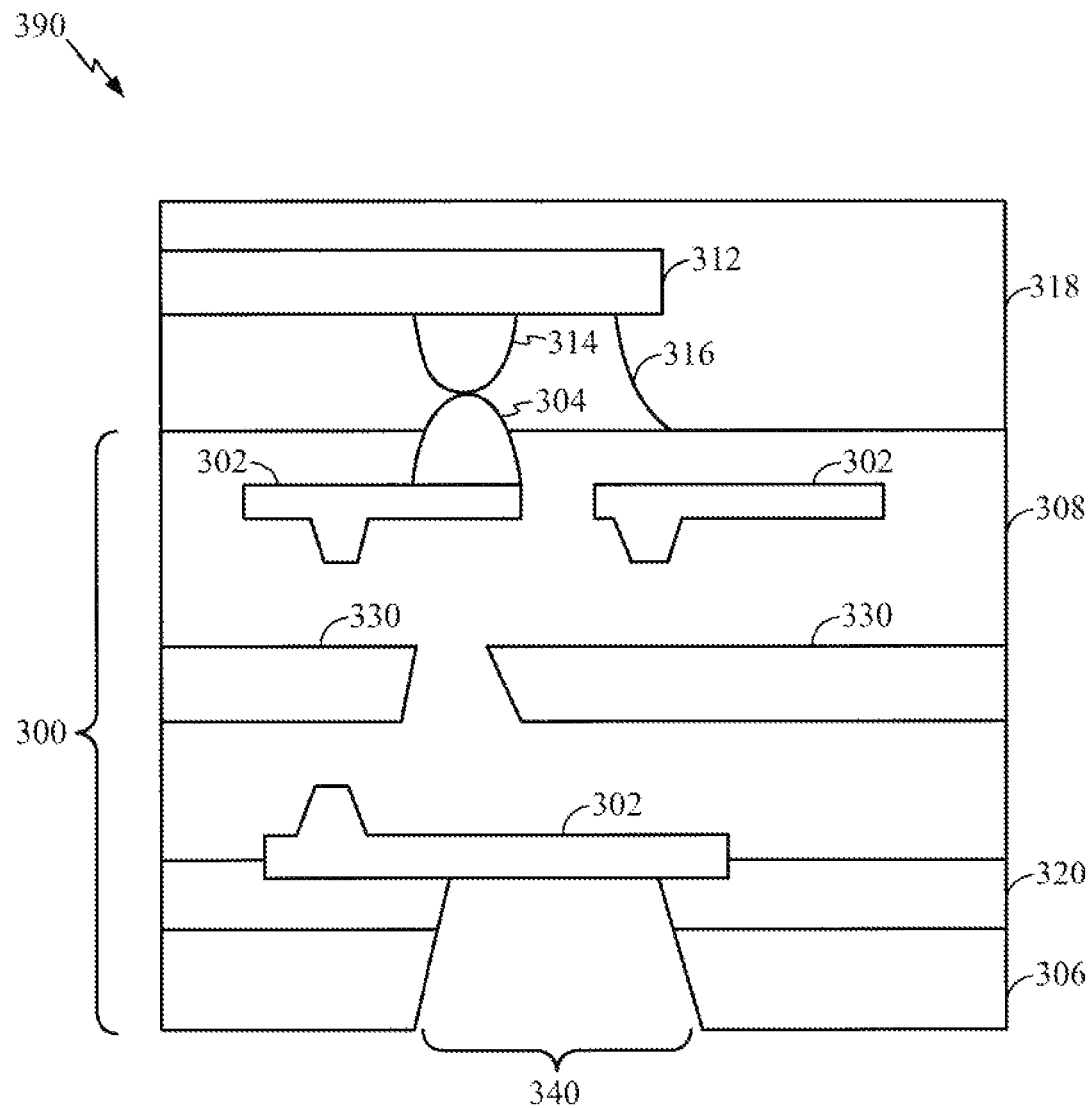

At block 235 the dielectric on the side of the packaging substrate opposite the attached die is patterned. FIG. 3G is a cross-sectional view illustrating an exemplary packaged circuit having a patterned dielectric according to one embodiment. The opening 340 is patterned into the dielectric 320 to expose a conductive line 302. According to one embodiment, a single process forms the opening 340 in the mold compound 306 and the dielectric 320 using ultraviolet (UV) laser drilling.

Patterning the dielectric 320 at block 235 after attaching the die 312 at block 215 reduces exposure of contact pads of the packaging substrate 300 to high temperatures and the environment. As a result, the dielectric 320 protects contact pads of the packaging substrate 300 from damage such as oxidation.

At block 240 a packaging connection may be deposited in the opening formed in the mold compound and dielectric to couple circuitry in the packaged integrated circuit to external devices. The mold compound located around the packaging connection acts as a collar around the packaging connection to prevent cracks in the packaging connection. For example, the mold compound moves the crack propagation surface further from the contact pad in the packaging connection.

Figure 3H:
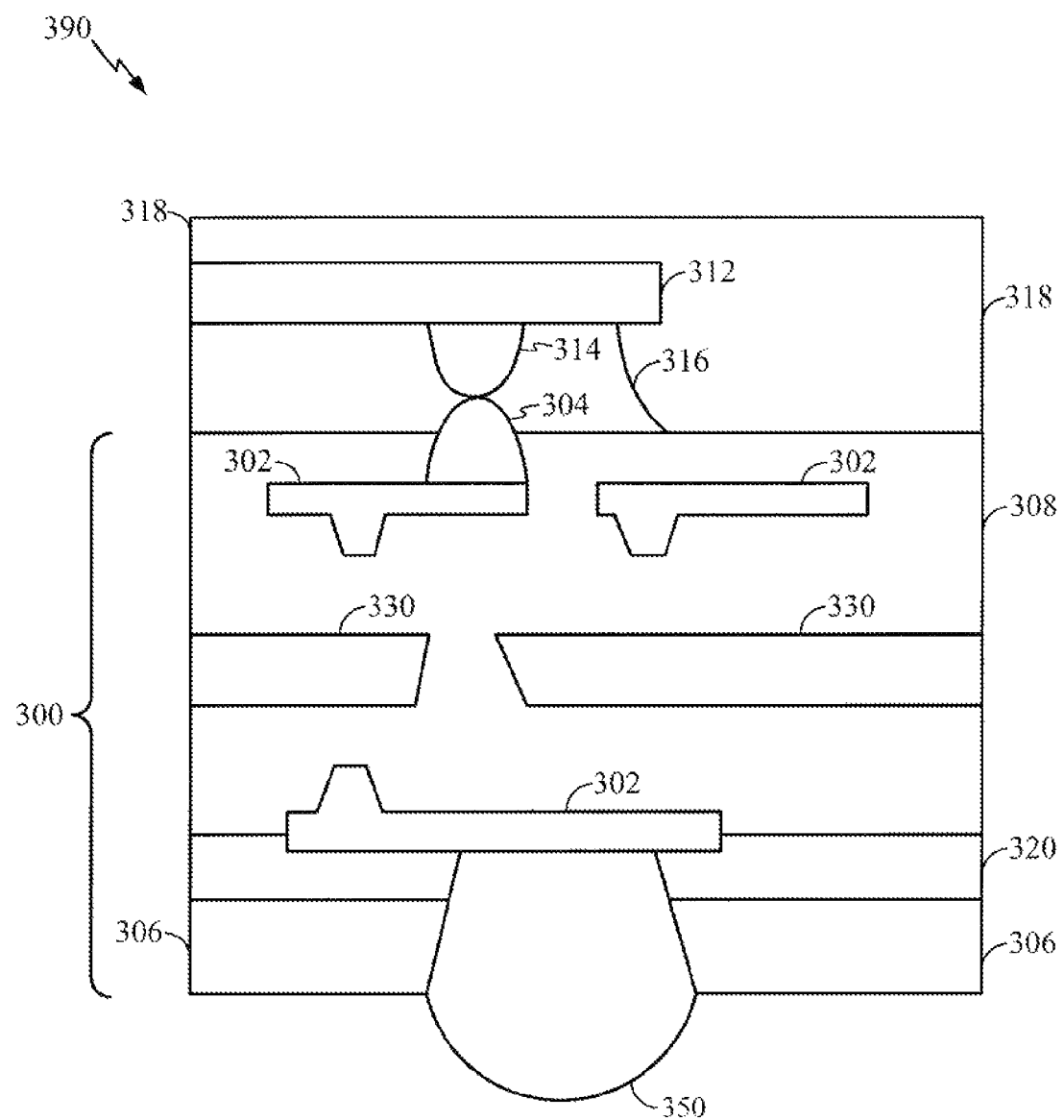

Referring now to FIG. 3H, a cross-sectional view illustrating an exemplary packaged integrated circuit having more reliable packaging connections according to one embodiment is shown. A packaging connection 350, such as for example, a ball of a ball grid array (BGA) may be deposited in the opening in the mold compound 306 and the dielectric 320. The packaging connection 350 couples to a contact pad of the conductive lines 302 in the packaging substrate 300. Communication between the die 312 and external circuitry may be transmitted through the packaging connection 314, the packaging connection 304, the conductive lines 302, and the packaging connection 350.

In FIG. 3H, the height of the packaged integrated circuit 390 is measured from the mold compound 318 to the packaging connection 350. The height of the mold, compound 306 adds little or no height to the packaged integrated circuit 390 because the mold compound 306 occupies space between the dielectric 320 and the packaging connection 350.

Depositing a mold compound on a side of a packaging substrate opposite an attached die improves chip attach yield, improves overall package yield, and stiffens the packaged integrated circuit. The mold compound increases stiffness of the packaging substrate reducing warpage of the substrate. That is, the extra stiffness provides a counter force for stresses that develop in the layers of the packaging substrate during manufacturing processes such as bake, reflow, and deflux. Additionally, the increased stiffness may allow use of thinner packaging substrates in the packaged integrated circuit, which may reduce the overall thickness of the packaged integrated circuit.

Reducing warpage of the packaging substrate improves chip attach yield. Warpage of the packaging substrate results in no-connects at the interface between the packaging substrate and the die. A reduction in warpage reduces the number of no-connects that occur during packaging. Additionally, reducing warpage of the packaging substrate improves coplanarity at the end of the manufacturing line resulting in increased overall package yield.

Patterning dielectric after die attach reduces exposure of contact pads of the packaging substrate to the environment, which reduces damage to the contact pad. For example, during high temperature processes involving the packaging substrate, if the contact pad is exposed to the environment oxidation of the contact pad may occur. Oxidation reduces electrical conductivity of the contact pad and also decreases solderability of the contact pad. Leaving dielectric on the contact, pad during high temperature processes reduces oxidation and, thus, improves ball attach yield when depositing balls of a ball grid array (BGA) on the contact pad.

Figure 4:
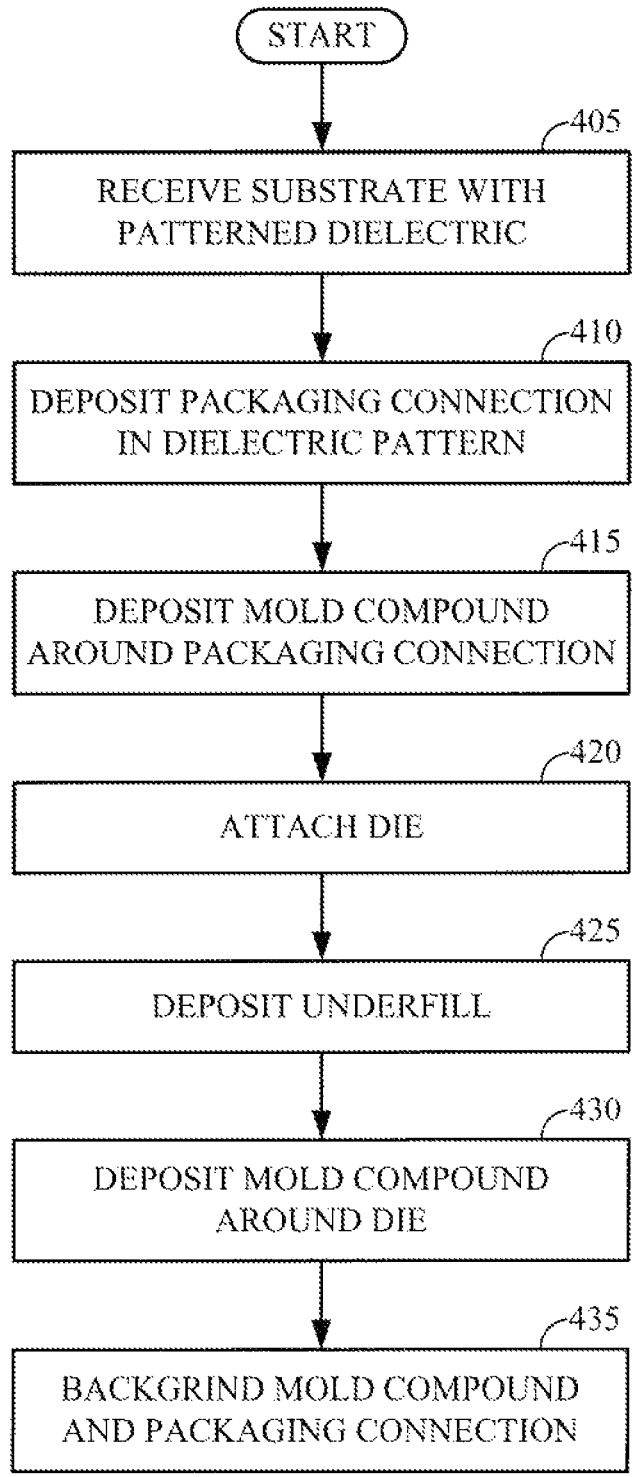
FIG. 4 is a flow chart illustrating an exemplary process for improving packaging connection reliability in packaged integrated circuits according to a second embodiment.
Figure 5A:
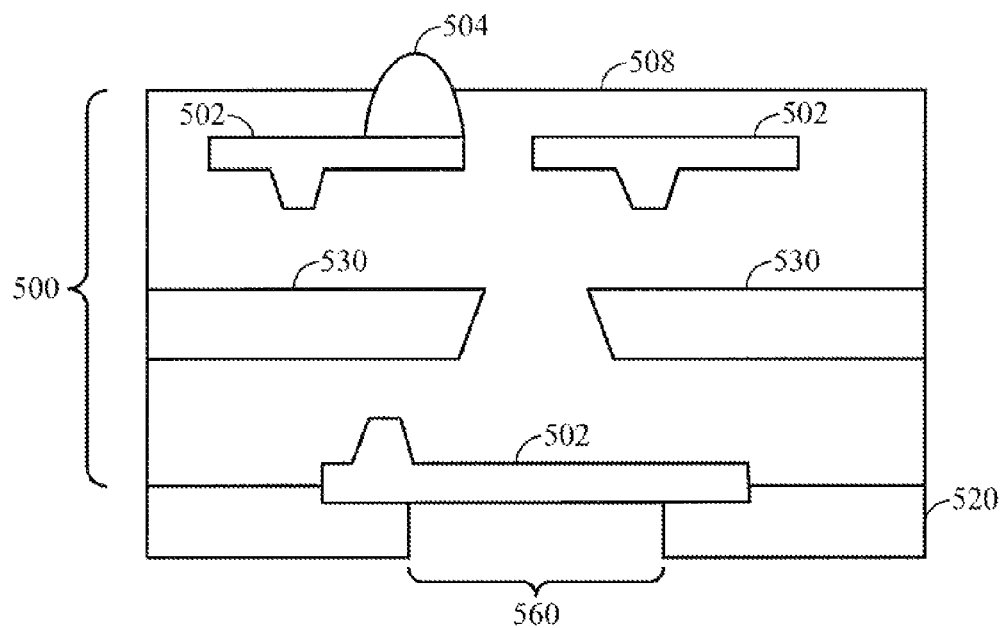
FIGS. 5A-5E are cross-sectional views illustrating an exemplary process for improving packaging connection reliability in packaged integrated circuits according to the second embodiment.

FIG. 4 is a flow chart illustrating an exemplary process for improving packaging connection reliability in packaged integrated circuits according to a second embodiment. A process begins at block 405 with receiving a packaging substrate. FIG. 5A is a cross-sectional view illustrating an exemplary packaging substrate according to one embodiment. A packaging substrate 500 includes conductive lines 502 separated by an insulator 508 on a base material 530 such as, for example, a laminate. A packaging connection 504 is coupled to a contact pad of the conductive lines 502. A dielectric 520 is located on the packaging substrate on a side opposite the packaging connection 504. According to one embodiment, the dielectric 520 is a solder resist. The dielectric 520 may have an opening 560 located near a contact pad of the packaging substrate 500.

Figure 5B:
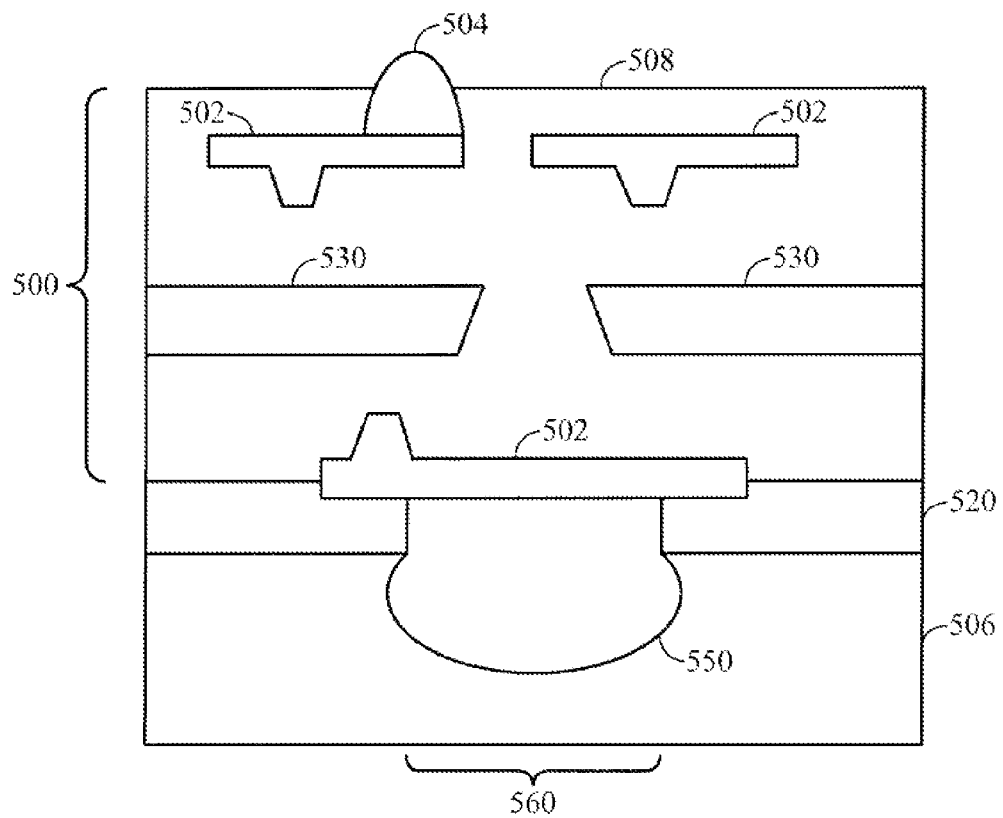

At block 410 a packaging connection is deposited in openings in the dielectric, and at block 415 a mold compound is deposited around the packaging connection. FIG. 5B is a cross-sectional view illustrating an exemplary packaging substrate after deposition of a mold compound according to one embodiment. A packaging connection 550 is deposited in the opening 560. The packaging connection 550 may be, for example, a ball of a ball grid array (BGA). A mold compound 506 is deposited around the packaging connection 550. Deposition of the mold compound 506 may include curing, damming, filling, and underfilling the mold compound 506.

Figure 5C:
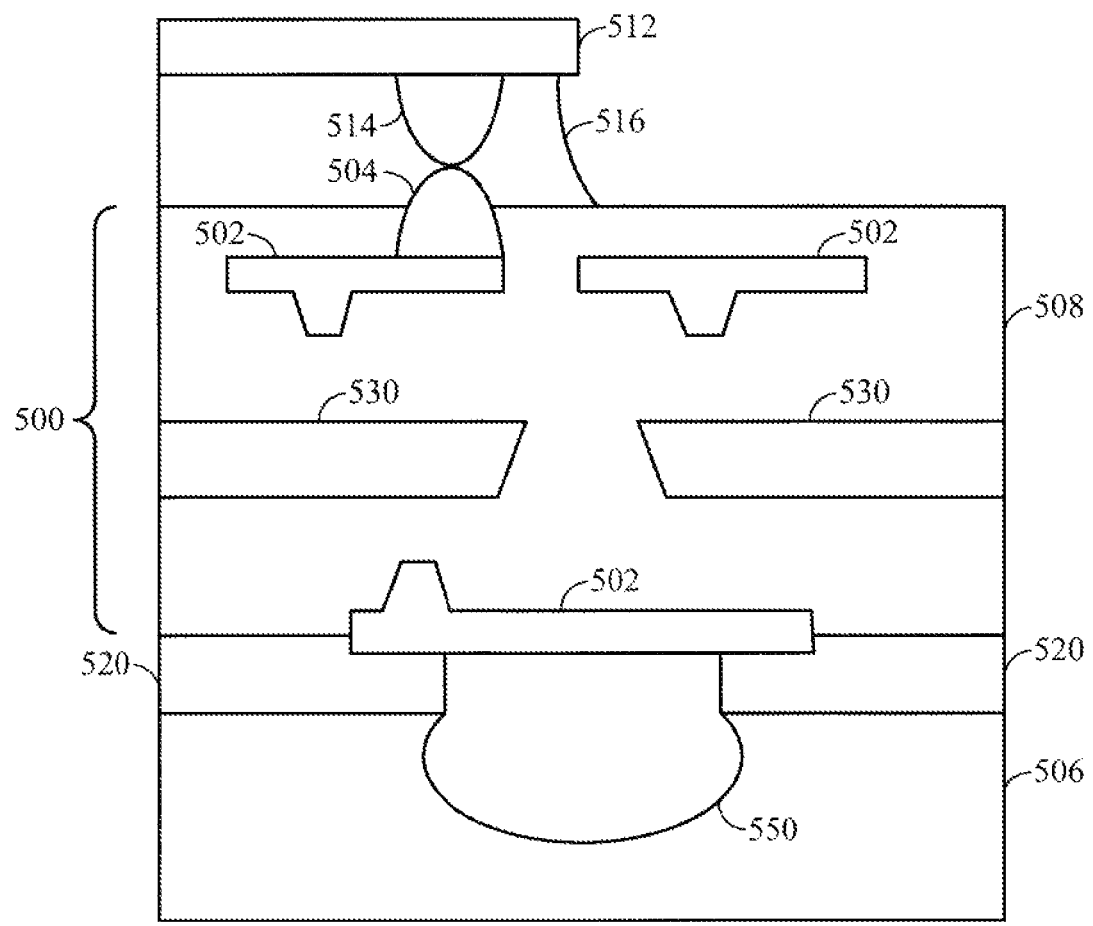

At block 420 a die is attached to the packaging substrate, and at block 425 an underfill is applied to the die. FIG. 5C is a cross-sectional view illustrating an exemplary packaging substrate after applying underfill to an attached die according to one embodiment. A die 512 with a packaging connection 514 is coupled to the packaging substrate 500 through the packaging connection 504. An underfill 516 is applied between the die 512 and the packaging substrate 500.

Figure 5D:
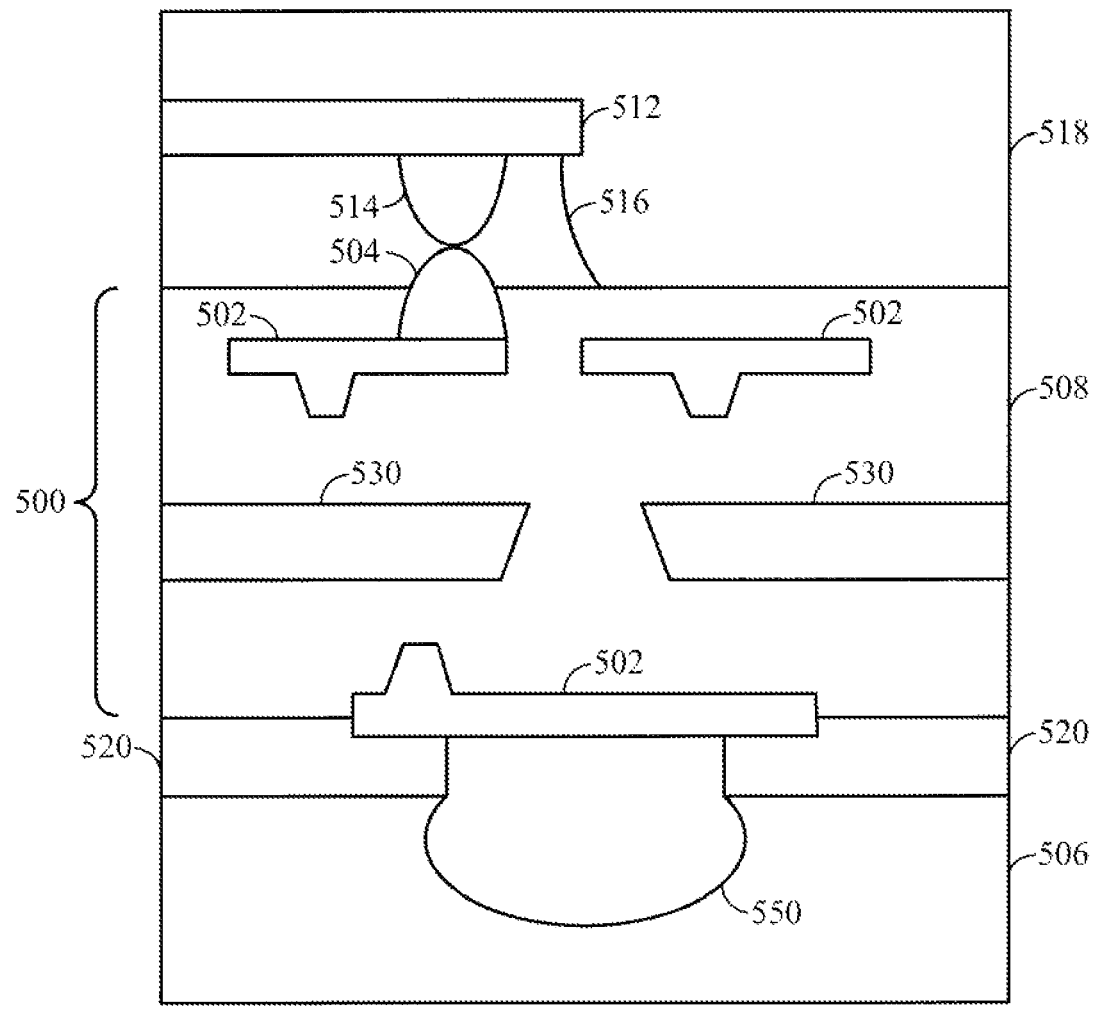

At block 430 a mold compound is deposited to the attached die. FIG. 5D is a cross-sectional view illustrating an exemplary packaging substrate after depositing a mold compound around the attached die according to one embodiment. A mold compound 518 is deposited on the packaging substrate 500 around the die 512.

Figure 5E:
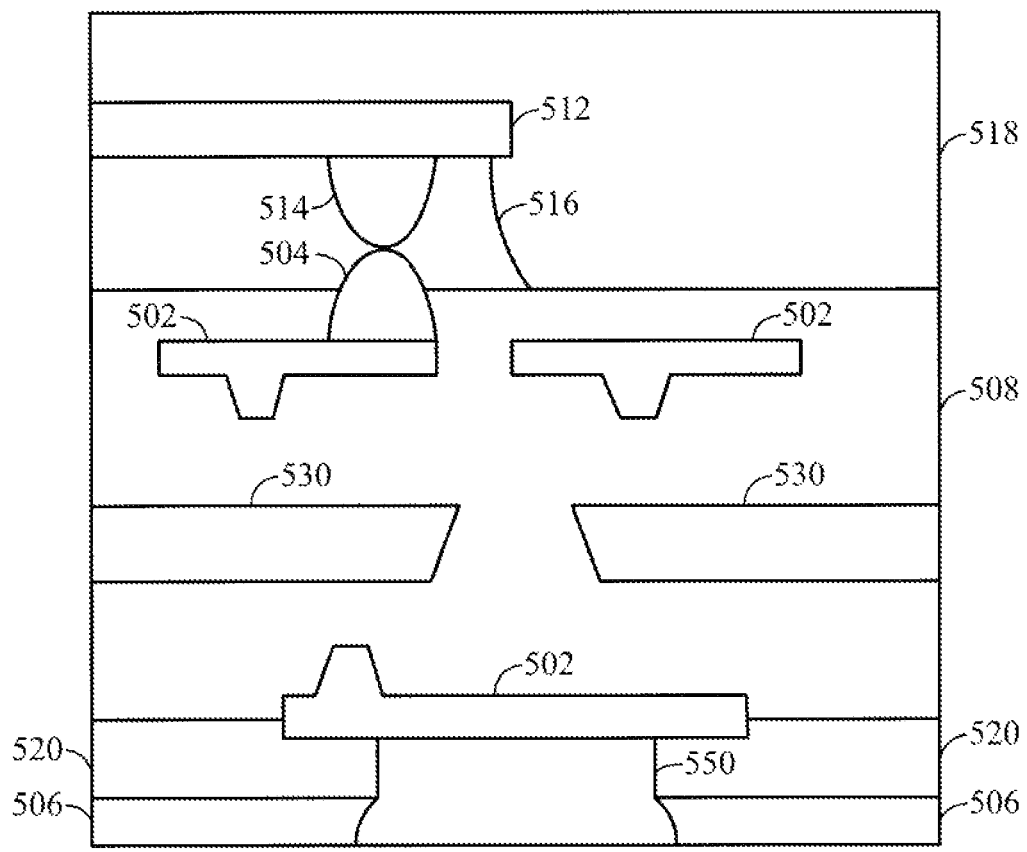

At block 435 the mold compound and packaging connection on the side opposite the attached die are background to expose the packaging connection. FIG. 5E is a cross-sectional view illustrating an exemplary packaging substrate after backgrinding the mold compound according to one embodiment. The mold compound 506 is background to expose the packaging connection 550. The mold compound 506 adds thickness to the packaging substrate 500 during packaging processes such as die attach to increase the strength of the packaging substrate 500. However, after backgrinding the mold compound 506 to expose the packaging connection 550, the mold compound 506 results in no additional thickness in a final product assembled with the packaging substrate 500.

According to one embodiment, a bare die is created by skipping block 430 and not depositing a mold compound 518 around the attached die 512. A bare die may be manufactured according to one embodiment for use in package-on-package (PoP) devices.

Figure 6:
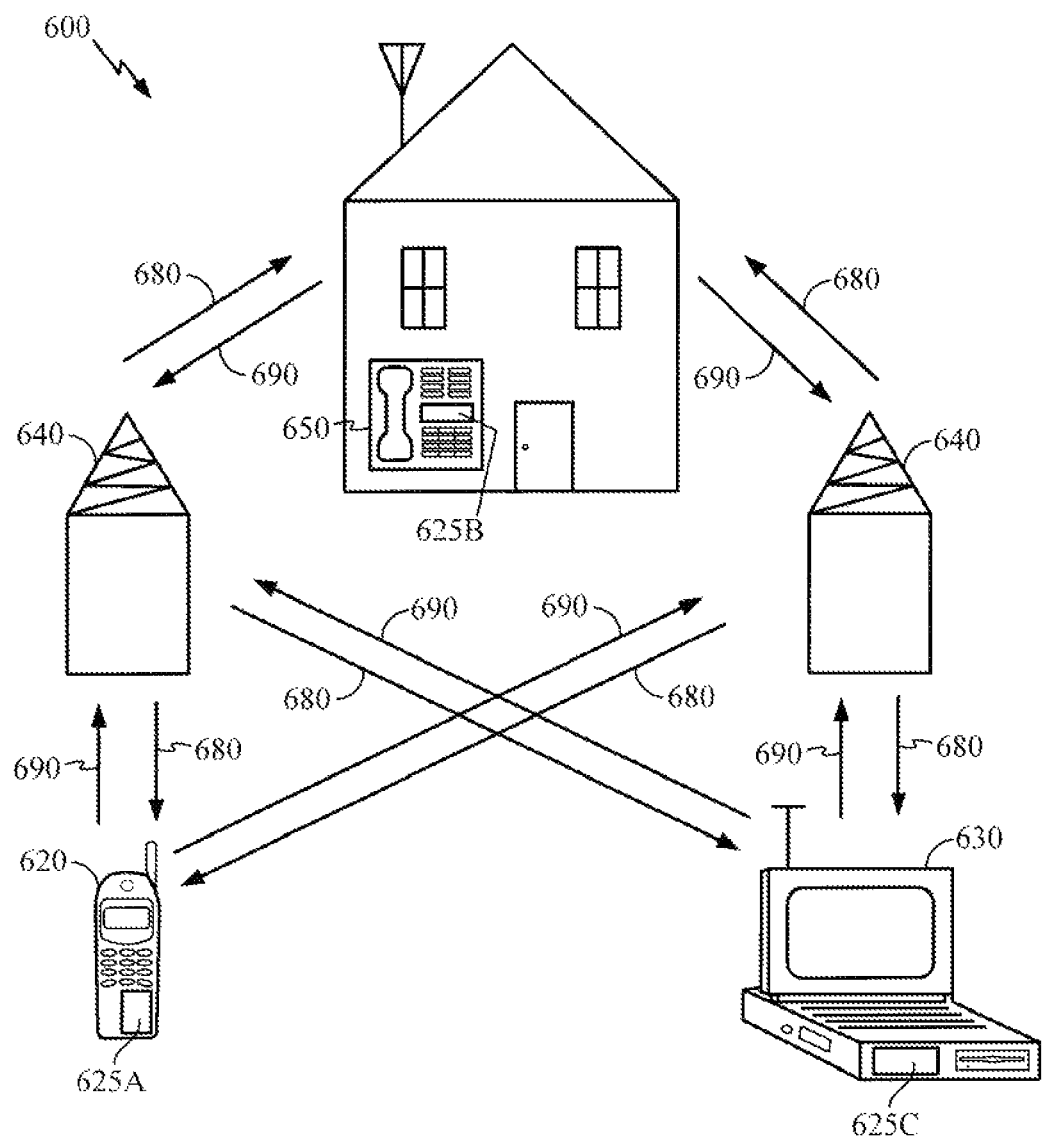
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, that include the disclosed packaging structure. It will be recognized that any device containing an IC may also include the packaging structure disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes packaged integrated circuits.

Figure 7:
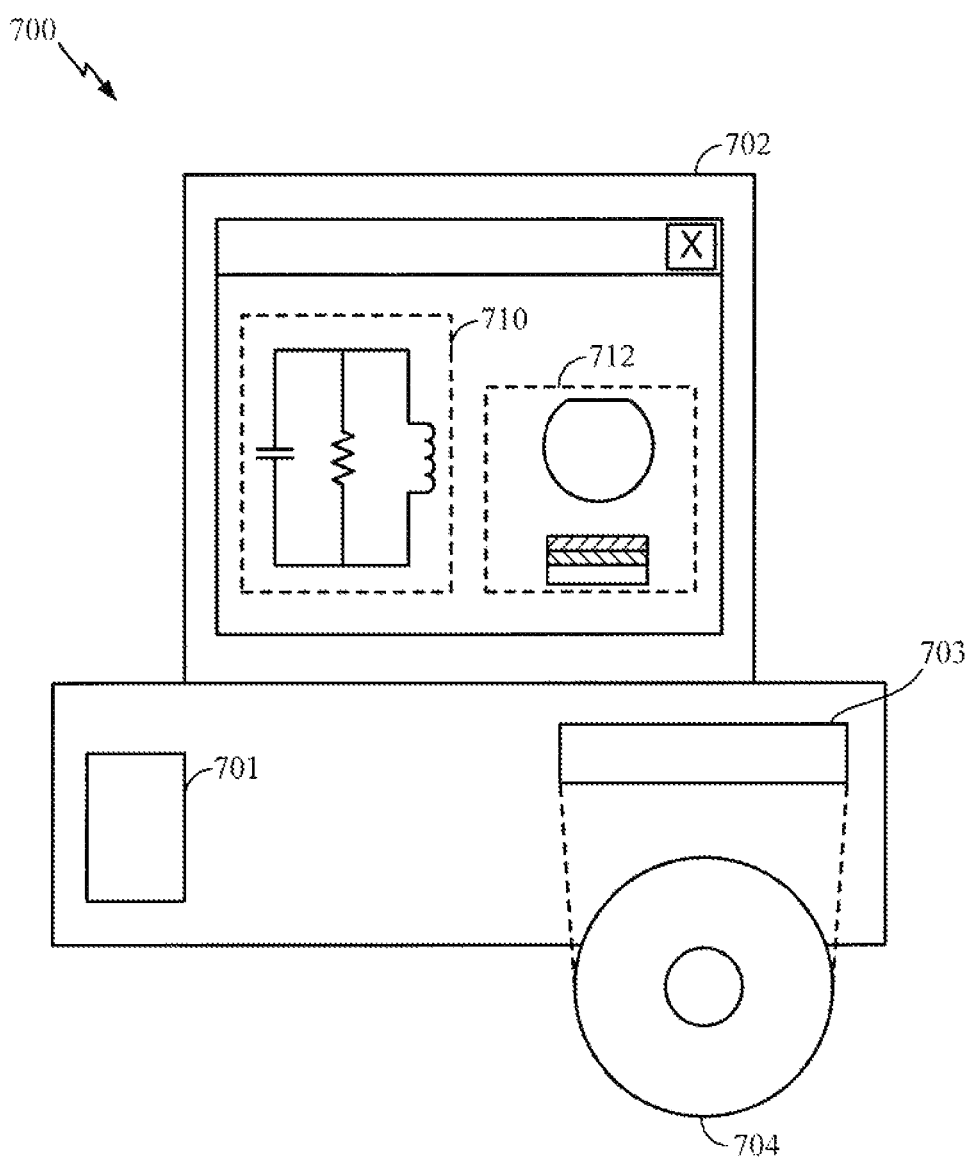
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as a packaged integrated circuit as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
   a packaging substrate;
   a dielectric on a first side of the packaging substrate;
   a first mold compound on the dielectric;
   a first packaging connection coupled to a contact pad on the first side of the packaging substrate through the first mold compound and the dielectric;
   a second mold compound disposed on a second side of the packaging substrate opposite the first side of the packaging substrate; and
   a die surrounded by the second mold compound and coupled to the packaging substrate.

2. The apparatus of claim 1, in which the first mold compound surrounds the first packaging connection.

3. The apparatus of claim 1, in which the dielectric comprises a solder resist.

4. The apparatus of claim 1, in which the die comprises a bare die.

5. The apparatus of claim 1, further comprising a packaged integrated circuit (IC) electrically coupled to the first packaging connection.

6. The apparatus of claim 1, in which the apparatus is integrated into a mobile phone a set top box, a music player, a video player, an entertainment unit, a navigation device, a computer, a hand-held personal communication systems (PCS) unit, a portable data unit, and/or a fixed location data unit.

7. The apparatus of claim 1, in which the first packaging connection is disposed such that a center line along the first packaging connection extends through the die.

8. The apparatus of claim 1, further comprising a second packaging connection, in which the first mold compound and the dielectric are disposed between and surround the first and the second packaging connections.

9. An apparatus, comprising:
   a packaging substrate;
   a dielectric on a first side of the packaging substrate;
   a first packaging connection coupled to a contact pad on the first side of the packaging substrate through the dielectric;
   means for packaging connection reliability on the first side of the packaging substrate, in which the packaging connection reliability means surrounds the first packaging connection; and
   means for connection reliability between a die and the packaging substrate, the die being surrounded by the connection reliability means on a second side of the packaging substrate opposite the first side of the packaging substrate.

10. The apparatus of claim 9, in which the dielectric comprises a solder resist.

11. The apparatus of claim 9, in which the apparatus is integrated into a mobile phone, a set top box, a music player, a video player, an entertainment unit, a navigation device, a computer, a hand-held personal communication systems (PCS) unit, a portable data unit, and/or a fixed location data unit.

12. The apparatus of claim 9, in which the first packaging connection is disposed such that a center line along the first packaging connection extends through the die.

13. The apparatus of claim 9, further comprising a second packaging connection, in which the packaging connection reliability means and the dielectric are disposed between and surround the first and the second packaging connections.

* * * * *